(12) United States Patent
Tanino

(10) Patent No.: US 6,217,842 B1
(45) Date of Patent: *Apr. 17, 2001

(54) SINGLE CRYSTAL SIC AND METHOD OF PRODUCING THE SAME

(75) Inventor: Kichiya Tanino, Sanda (JP)

(73) Assignee: Nippon Pillar Packing Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/147,620

(22) PCT Filed: Jun. 23, 1998

(86) PCT No.: PCT/JP98/02797

§ 371 Date: Feb. 3, 1999

§ 102(e) Date: Feb. 3, 1999

(87) PCT Pub. No.: WO98/59099

PCT Pub. Date: Dec. 30, 1998

(30) Foreign Application Priority Data

Jun. 25, 1997 (JP) ..................................................... 9-207039

(51) Int. Cl.[7] ................ C30B 1/04; C30B 29/36
(52) U.S. Cl. .................. 423/345; 117/4; 117/7; 117/9; 117/84; 117/88; 117/951
(58) Field of Search ................ 117/4, 7, 9, 84, 117/87, 88, 951; 428/620; 423/345

(56) References Cited

U.S. PATENT DOCUMENTS 4,590,130 * 5/1986 Cline ................................. 428/446

* cited by examiner

*Primary Examiner*—Benjamin L. Utech
*Assistant Examiner*—Donald L. Champagne
(74) *Attorney, Agent, or Firm*—Jones, Tullar & Cooper, P.C.

(57) ABSTRACT

According to the present invention, a complex (M) which is formed by growing a polycrystalline β-SiC plate 2 having a thickness of 10 μm or more on the surface of a single crystal α-SiC base material 1 by the PVD method or the thermal CVD method is heat-treated at a temperature of the range of 1,650 to 2,400° C., whereby polycrystals of the polycrystalline cubic β-SiC plate 2 are transformed into a single crystal, and the single crystal oriented in the same direction as the crystal axis of the single crystal α-SiC base material 1 is grown. As a result, single crystal SiC of high quality which is substantially free from micropipe defects and defects affected by the micropipe defects can be produced easily and efficiently.

11 Claims, 3 Drawing Sheets

SINGLE CRYSTAL SIC AND METHOD OF PRODUCING THE SAME

CROSS REFERENCE TO RELATED APPLICATION

This application discloses subject matter in common with pending application Ser. No. 09/147,456, filed Dec. 29, 1998.

TECHNICAL FIELD

The present invention relates to single crystal SiC and a method of producing the same, and more particularly to single crystal SiC which is used as a substrate wafer for a high temperature semiconductor electronic element such as a light-emitting diode, a ULSI (Ultra Large-Scale Integrated circuit), a rectifying element, a switching element, an amplifying element, and an optical sensor, and also to a method of producing the same.

BACKGROUND ART

SiC (silicon carbide) is superior in heat resistance and mechanical strength than existing semiconductor materials such as Si (silicon) and GaAs (gallium arsenide), and also in its high-temperature property, high-frequency property, dielectric property, and resistance to environments. In addition, it is easy to perform valence control of electrons and holes by doping an impurity. Moreover, SiC has a wide band gap (for example, single crystal 6H-SiC has a band gap of about 3.0 eV, and single crystal 4H-SiC has a band gap of 3.26 eV). For these reasons, SiC receives attention and is expected as a semiconductor material for a next-generation power device.

As a method of growing (producing) single crystal SiC of this type, known are a method in which single crystal SiC is grown by a sublimation and recrystallization method using a seed crystal, and that in which, in the case of a high temperature, epitaxial growth is conducted on a silicon substrate by using a chemical vapor deposition method (CVD method), thereby growing single crystal cubic SiC (β-SiC).

In the above-described conventional production methods, however, the crystal growth rate is as low as 1 μm/hr. Furthermore, the sublimation and recrystallization method has a problem in that pin holes which have a diameter of several microns and which pass through the crystal in the growing direction remain at about 100 to 1,000/cm$^2$ in a growing crystal. Such pin holes are called micropipe defects and cause a leakage current when a semiconductor device is fabricated. These problems block a practical use of single crystal SiC which has superior characteristics as compared with other existing semiconductor materials such as Si and GaAs as described above.

In the case of the high-temperature CVD method, the substrate temperature is as high as 1,700 to 1,900° C., and it is required to produce a high-purity reducing atmosphere. Therefore, the method has a problem in that it is difficult to conduct the method from the view point of installation. Furthermore, the method has another problem in that, because of epitaxial growth, the growth rate is naturally limited.

SUMMARY OF THE INVENTION

It is an object of the present invention to provide single crystal SiC of high quality which is little affected by lattice defects and micropipe defects, and a method of producing single crystal SiC which can produce such single crystal SiC easily and efficiently from the point of view of installation and workability, and which can expedite the practical use of the single crystal as a semiconductor material.

The single crystal SiC of the present invention is characterized in that a complex in which a polycrystalline plate consisting of Si and C atoms and having a thickness of 10 μm or more is stacked on the surface of a single crystal SiC base material and is subjected to a heat treatment, whereby polycrystals of the polycrystalline plate are transformed into a single crystal.

According to the thus configured present invention, polycrystals of the polycrystalline plate are phase-transformed by only applying means which thermally processes a complex consisting of a single crystal SiC base material and a polycrystalline plate stacked on the surface of the base material, and which is simple from the point of view of installation and workability, so that a single crystal which is oriented in the same direction as the crystal axis of the single crystal SiC base material is efficiently grown. Furthermore, the thickness of the polycrystalline plate of the complex is set to be 10 μm or more. Even when micropipe defects which impede transformation of polycrystals of the polycrystalline plate into a single crystal exist in the vicinity of the surface of the single crystal SiC base material, therefore, a single crystal can be grown to a large size in a range where the single crystal is not affected by the defects. Consequently, it is possible to obtain single crystal SiC of high quality which is substantially free from micropipe defects and defects affected by the micropipe defects. As a result, it is possible to attain the effect of expediting the practical use of single crystal SiC which is superior in its high-temperature property, high-frequency property, dielectric property, and a high resistance to environments to existing semiconductor materials such as Si (silicon) and GaAs (gallium arsenide), and which is expected as a semiconductor material for a power device.

The method of producing single crystal SiC of the present invention is characterized in that a polycrystalline plate consisting of Si and C atoms and having a thickness of 10 μm or more is stacked on the surface of a single crystal SiC base material, the complex is then subjected to a heat treatment to transform polycrystals of the polycrystalline plate into a single crystal and grow the single crystal.

Also the thus configured production method can attain the effect that single crystal SiC of high quality which is substantially free from micropipe defects and defects affected by the micropipe defects is grown easily and efficiently so that single crystal SiC which is available as a semiconductor material having a very high performance can be stably produced and supplied on an industrial scale.

In the single crystal SiC and the method of producing single crystal SiC of the present invention, when the polycrystalline plate constituting the complex is a polycrystalline β-SiC plate grown on the surface of a single crystal SiC base material by physical vapor deposition or thermochemical vapor deposition and the thermochemical vapor deposition temperature of the polycrystalline β-SiC plate is set to be in the range of 1,300 to 1,600° C., the present invention attains an effect that single crystal SiC of high purity and high quality and having lattice defects and micropipe defects which are smaller in number than those of the single crystal SiC base material can be obtained, while suppressing the entering of impurities between the single crystal SiC base material and the polycrystalline plate on the surface thereof, and diffusion of the impurities.

DESCRIPTION OF THE PREFERRED EMBODIMENTS

Figure 1:
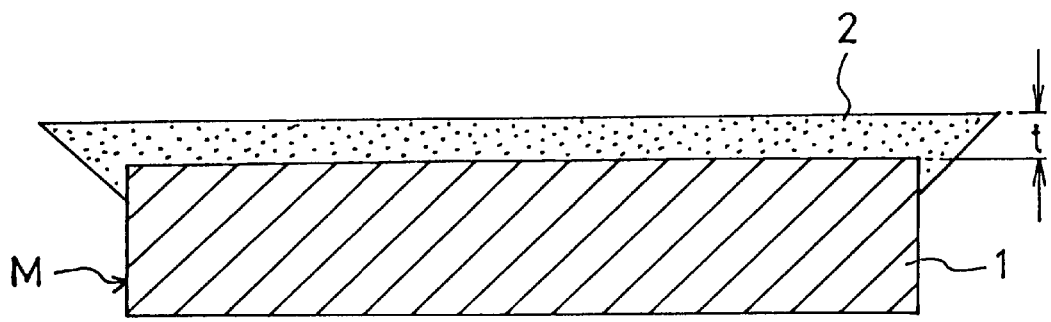
FIG. 1 is a diagram showing a complex before the single crystal SiC of the present invention is heat-treated.
Figure 2:
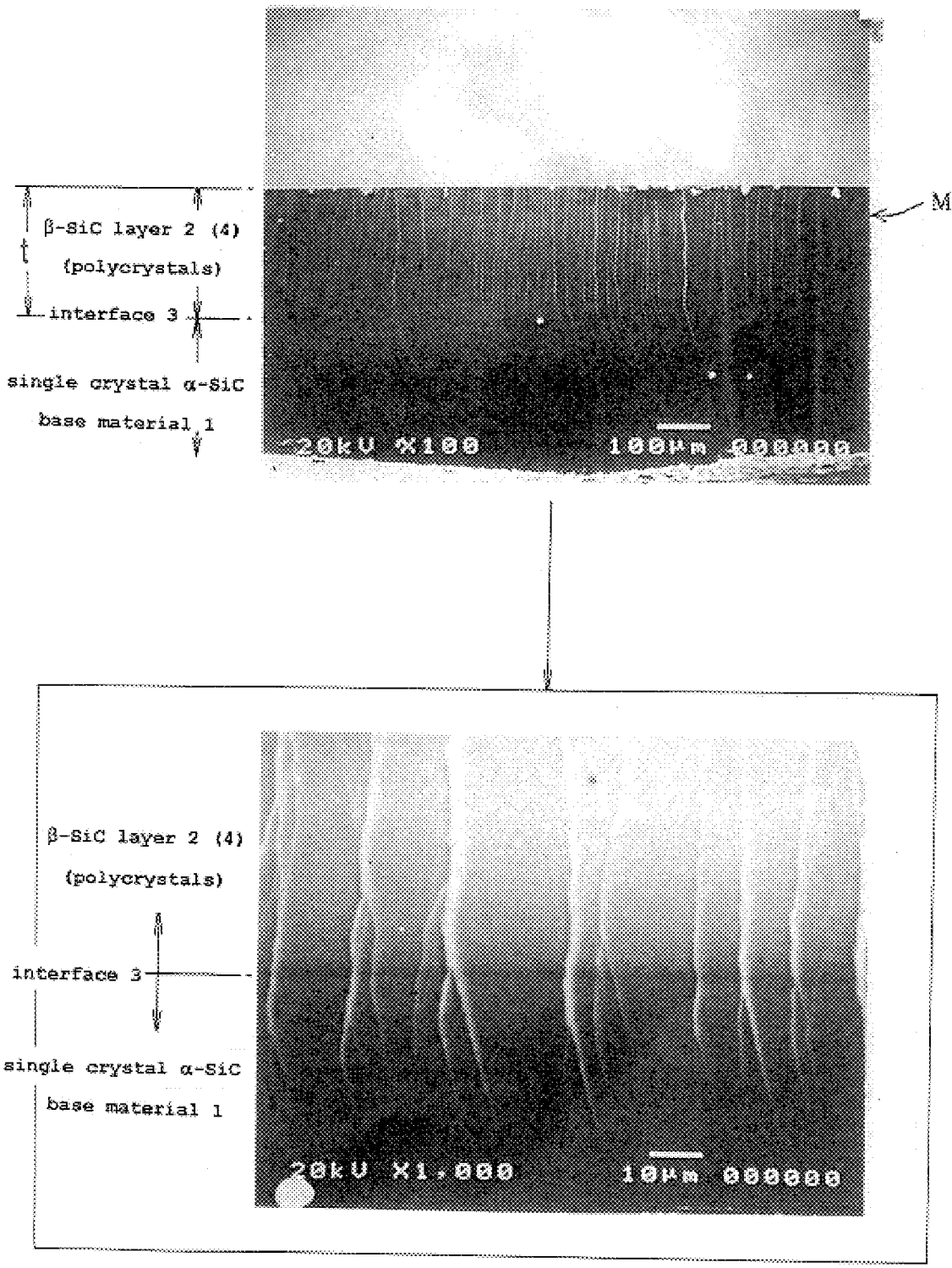
FIG. 2 shows a microphotograph of an enlarged view of a main portion before the single crystal SiC of the present invention is heat-treated.

Hereinafter, an embodiment of the present invention will be described. FIG. 1 diagrammatically shows a complex M before single crystal SiC is heat-treated. The complex M is formed by growing a polycrystalline cubic β-SiC plate 2 having a thickness (t) of 10 μm or more on the surface of a single crystal hexagonal α-SiC base material 1 (6H type or 4H type) by the radio frequency magnetron sputtering method (hereinafter, referred to as the PVD method) or the thermochemical vapor deposition method (hereinafter, referred to as the thermal CVD method) in the temperature range of 1,300 to 1,600° C. As clearly shown in a microphotograph of an etched section of FIG. 2, in the stage of growing the polycrystalline β-SiC plate 2, polycrystals 4 of the polycrystalline β-SiC plate 2 are grown on the surface of the single crystal α-SiC base material 1 where lattice defects and micropipe defects remain, and the single crystal α-SiC base material 1 and the polycrystalline β-SiC plate 2 contact each other at crystal faces of different crystal forms so as to show a clear linear interface 3.

Figure 3:
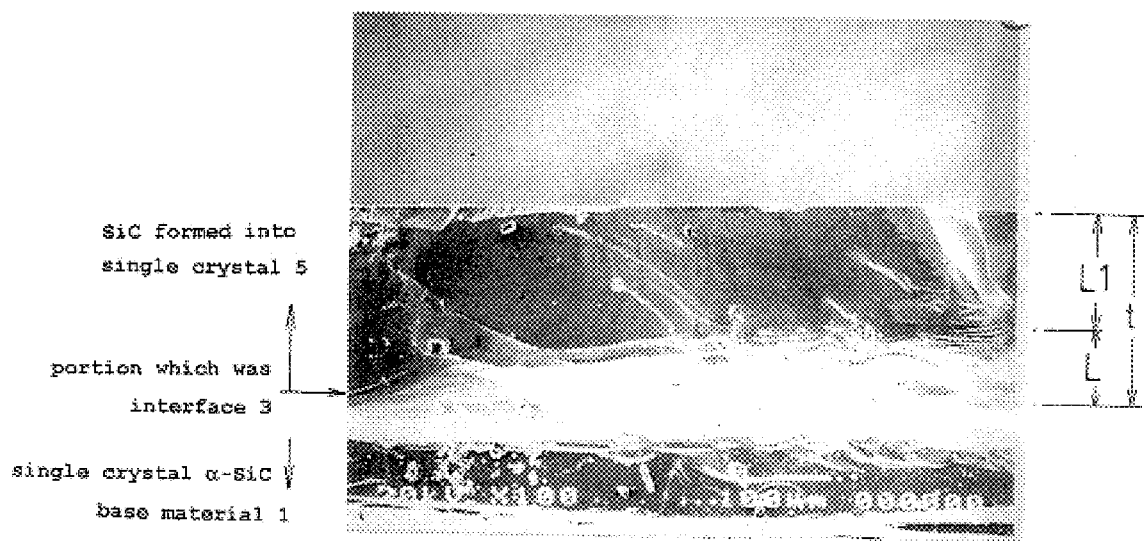
FIG. 3 is a microphotograph showing an enlarged view of a main portion after the single crystal SiC of the present invention is heat-treated.

Thereafter, the whole of the complex M is heat-treated in a saturated SiC vapor pressure and in a temperature range of 1,600 to 2,400° C., preferably 2,000 to 2,200° C. Therefore, crystal growth mainly consisting of solid-phase growth, such that lattice vibration occurs in the interface 3 to change the atom arrangement is generated. As a result, as clearly shown in a microphotograph of an etched section of FIG. 3, polycrystals 4 of the polycrystalline β-SiC plate 2 are phase-converted into α-SiC, and a single crystal 5 which is oriented in the same direction as the crystal axis of the single crystal α-SiC base material 1 is grown on the polycrystalline β-SiC plate 2, with being integrated with the single crystal of the single crystal α-SiC base material 1.

In the vicinity of the surface of the single crystal α-SiC base material 1 constituting the interface 3 in the complex M, pin hole-like micropipe defects are scattered. In a place where such micropipe defects exist, the single crystal 5 which, as a result of the above-mentioned heat process, is to be grown integrally with the single crystal of the base material 1 while orienting the polycrystals 4 of the polycrystalline β-SiC plate 2 in the same direction as the crystal axis of the single crystal α-SiC base material 1 is not sufficiently grown, or, even when the single crystal is grown, micropipe defects and defects affected by the micropipe defects remain in the vicinity of the interface 3, specifically, in a range L of a thickness of 10 μm or less from the interface 3. Single crystal SiC containing such defects has a very low quality.

In consideration of this point, in the present invention, the polycrystalline β-SiC plate 2 is grown to the thickness (t) of 10 μm or more on the surface of a single crystal α-SiC base material 1 of the complex M. According to this configuration, it is possible to grow the single crystal 5 which is completely free from micropipe defects and defects affected by the micropipe defects, on the side of the polycrystalline β-sic plate 2 in a range L1 other than the range L where the above-mentioned defects remain. When the single crystal 5 in the range L1 used, single crystal SiC of high quality can be obtained.

The following experiment was conducted on a sample of single crystal SiC which was produced by the method described below.

By using a radio frequency magnetron sputtering apparatus, a β-SiC material is placed as a target on the surface of the single crystal α-SiC base material 1, and a film is grown for 20 hours in total under the conditions of an Argon (Ar) atmosphere, 0.1 Torr, and a base material temperature of 600° C. Next, the base material is placed in a CVD-SiC lidded crucible, and it is heat treated at 2,200° C. for 5 hours while maintaining the saturated SiC vapor pressure. The sputtered surface on the side of the polycrystalline β-SiC plate is slightly polished, and the base material is boiled in a mixed aqueous solution of calcium hydroxide (CaOH) and red prussiate of potash. Thereafter, the surface is etched. The surface was observed by a Nomarski interference microscope with magnifications of 400 times. As a result, no grain boundary was observed.

Furthermore, X-ray diffraction due to a crystal was conducted on a sample of the single crystal SiC sample produced as described above, by using an X-ray diffraction apparatus, and a diffraction pattern in which the abscissa is 2θ and the ordinate is the diffraction strength was measured. As a result, sharp peaks of the diffraction strength were observed at regular intervals, at the CuKα line, and between 40 to 70° of 2θ. Therefore, it was confirmed that the sample of the single crystal SiC sample produced as described above is a single crystal in which constituting atoms are regularly arranged.

In the embodiment, the single crystal α-SiC base material 1 is used as the single crystal SiC base material. Alternatively, for example, an α-SiC sintered member or a single crystal β-SiC member may be used. In the embodiment, the polycrystalline cubic β-SiC plate 2 which is grown on the surface of the single crystal α-SiC base material 1 by the PVD method or the thermal CVD is used as the polycrystalline plate. Alternatively, for example, a polycrystalline α-SiC plate, an SiC sintered member of high purity, or an amorphous plate of high purity ($10^{14atm}/cm^3$) or less may be used, and it is possible to obtain single crystal SiC of high quality in the same manner as the embodiment.

As the single crystal α-SiC base material 1 in the embodiment, either of the 6H type or the 4H type may be used. When the 6H type is used, a single crystal which is converted from polycrystals of the polycrystalline β-SiC plate 2 into α-SiC as the progress of the heat treatment is easily grown in the same form as that of a single crystal of the 6H type. When the single crystal base material 1 of the 4H type is used, a single crystal in the same form as that of a single crystal of the 4H type is easily converted and grown.

Preferably, the temperature conditions of the heat treatment of the complex M are set to be 1,650 to 2,400° C., and the process time period is 1 to 3 hours. When the temperature of the heat treatment is lower than 1,650° C., the kinetic energy of atoms cannot be given to many SiC constituting the interface. When the temperature is higher than 2,400° C., thermal energy which is very much higher than the decomposition energy of SiC is supplied and crystals of SiC themselves are decomposed.

As described above, the present invention provides a technique that a complex in which a polycrystalline plate consisting of Si and C atoms and 10 μm or more is stacked on the surface of a single crystal SiC base material a is subjected to a heat treatment, so that polycrystals of the polycrystalline plate are transformed into a single crystal, and a single crystal oriented in the same direction as the crystal axis of the single crystal SiC base material is integrally grown to a large size, whereby a single crystal of high quality which is superior in heat resistance and mechanical strength and which is substantially free from micropipe defects and defects affected by the micropipe defects can be produced easily and efficiently.

What is claimed is:

1. Single crystal SiC comprising: a single crystal SiC base material formed into a complex in which a polycrystalline plate consisting of Si and C atoms and having a thickness of 10 μm or more was stacked on a surface of said single crystal SiC base material, and the complex was subjected to a heat treatment, whereby polycrystals of said polycrystalline plate were transformed into a single crystal.

2. Single crystal SiC according to claim 1, wherein said single crystal SiC base material constituting said complex is single crystal α-SiC.

3. Single crystal SiC according to claim 1, wherein said polycrystalline plate constituting said complex is a polycrystalline β-SiC plate which was grown on the surface of said single crystal SiC base material by one of: a physical vapor deposition, and a thermochemical vapor deposition method.

4. Single crystal SiC according to claim 3, wherein said polycrystalline β-SiC plate is a plate which was grown on the surface of said single crystal SiC base material by a thermochemical vapor deposition in a range of 1,300 to 1,600° C.

5. A method for producing single crystal SiC, comprising the steps of: stacking a polycrystalline plate consisting of Si and C atoms and having a thickness of 10 μm or more on a surface of a single crystal SiC base material, forming thereby a complex; and subjecting the complex to a heat treatment to transform polycrystals of the polycrystalline plate into a single crystal, whereby polycrystals of the polycrystalline plate are transformed and grown into a single crystal.

6. A method of producing single crystal SiC according to claim 5, wherein single crystal α-SiC is used as the single crystal SiC base material constituting the complex.

7. A method of producing single crystal SiC according to claim 5, wherein the polycrystalline plate comprises a polycrystalline β-SiC plate which is grown on the surface of the single crystal SiC base material by one of a physical vapor deposition, and a thermochemical vapor deposition method.

8. A method of producing single crystal SiC according to claim 7, wherein the polycrystalline β-SiC plate is grown on the surface of the single crystal SiC base material by a thermochemical vapor deposition in a range of 1,300 to 1,600° C.

9. A method of producing single crystal SiC according to claim 7, wherein a temperature of the heat treatment of the complex is conducted at a temperature which is higher than a thermochemical vapor deposition temperature in a formation of the polycrystalline β-SiC plate, and in a saturated SiC vapor pressure.

10. A method of producing single crystal SiC according to claim 9, wherein the temperature of the heat treatment of the complex is 1,650 to 2,400° C.

11. A method of producing single crystal SiC according to claim 9, wherein the temperature of the heat treatment of the complex is 2,000 to 2,200° C.

* * * * *